US009846096B2

(12) United States Patent
Chen et al.

(10) Patent No.: US 9,846,096 B2
(45) Date of Patent: Dec. 19, 2017

(54) SYMMETRICAL PIEZORESISTIVE PRESSURE SENSOR WITH STACKING ICS

(71) Applicant: Continental Automotive Systems, Inc., Auburn Hills, MI (US)

(72) Inventors: Shiuh-Hui Steven Chen, Lake Zurich, IL (US); Robert C Kosberg, Grayslake, IL (US); Jen-Huang Albert Chiou, Libertyville, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 122 days.

(21) Appl. No.: 15/082,472

(22) Filed: Mar. 28, 2016

(65) Prior Publication Data

US 2016/0299025 A1    Oct. 13, 2016

Related U.S. Application Data

(60) Provisional application No. 62/145,182, filed on Apr. 9, 2015.

(51) Int. Cl.

| G01L 7/08 | (2006.01) |
|---|---|
| G01L 9/00 | (2006.01) |
| G01L 9/06 | (2006.01) |
| G01L 19/00 | (2006.01) |
| G01L 19/14 | (2006.01) |

(52) U.S. Cl.
CPC .......... *G01L 9/0054* (2013.01); *G01L 9/0042* (2013.01)

(58) Field of Classification Search
CPC ..... G01L 7/00; G01L 7/08; G01L 9/00; G01L 9/0042; G01L 9/0055; G01L 9/06; G01L 19/00; G01L 19/0076; G01L 19/0084; G01L 19/14; G01L 9/0052; B81B 7/00
See application file for complete search history.

(56) References Cited

U.S. PATENT DOCUMENTS

| 6,078,229 A * | 6/2000 | Funada ................ H03H 9/059 |
| | | 29/25.35 |
| 6,427,539 B1 | 8/2002 | Chen et al. |
| 8,779,536 B2 | 7/2014 | Weber |

(Continued)

FOREIGN PATENT DOCUMENTS

| CN | 101271029 A | 9/2008 |
| EP | 0316257 A1 | 5/1989 |
| GB | 2539631 A * | 12/2016 ........... G01L 9/0042 |

OTHER PUBLICATIONS

Search Report dated Dec. 14, 2015, from corresponding GB Patent Application No. GB1507263.0.

*Primary Examiner* — Nguyen Ha

(57) ABSTRACT

Electrical and mechanical noise in a microelectromechanical system (MEMS) pressure sensor are reduced by the symmetrical distribution of bond pads, conductive vias and interconnects and by the elimination of bond wires used in the prior art to connect a MEMS pressure sensing element to an application specific integrated circuit (ASIC). The bond wires are eliminated by using conductive vias to connect an ASIC to a MEMS pressure sensing element. Extraneous electrical noise is suppressed by conductive rings that surround output signal bond pads and a conductive loop that surrounds the conductive rings and bond pads. The conductive rings and loop are connected to a fixed voltage or ground potential.

21 Claims, 13 Drawing Sheets

(56) References Cited

U.S. PATENT DOCUMENTS

2009/0052699 A1* 2/2009 Andersen ............... H04R 17/02
                                                     381/173
2014/0374852 A1   12/2014 Raleigh et al.

* cited by examiner

SYMMETRICAL PIEZORESISTIVE PRESSURE SENSOR WITH STACKING ICS

BACKGROUND

Micro-electromechanical system (MEMS) pressure sensors are well known for providing excellent pressure measurements for a wide range of fluids across a wide range of low pressures. At least one such device is disclosed in U.S. Pat. No. 8,302,483 entitled, "Robust Design of High Pressure Sensor Device" issued on Nov. 6, 2012, the entire content of which is incorporated herein by reference.

Put simply, a MEMS pressure sensing device comprises essentially two dies made of silicon, one being a MEMS pressure sensing element; the other being an application specific integrated circuit (ASIC) that process signals from the sensing element and produces a signal representing a sensed pressure.

In the prior art, the two dies are mounted in a housing and connected to each other using small-diameter bond wires. The bond wires also extend between and connect the ASIC and one or more lead frames, which are conductors that pass through the housing and provide external-to-the-housing electrical connections.

While prior art MEMS pressure sensors work well, they are susceptible to both electrical and mechanical noise, which distorts the sensor's accuracy. Eliminating mechanical and electrical noise would be an improvement over the prior art.

Mechanical noise is mainly caused by how the MEMS pressure sensing element is packaged in a housing. Electrical noise is mainly caused by electric fields around the sensor and which are sensed or detected by the small lead wires that connect the MEMS piezoresistive element to a circuit that processes the output voltages from the Wheatstone bridge.

Mechanical noise can be eliminated by repackaging the MEMS pressure sensor such that it does not require a prior art housing gel, over molding or other packaging that can distort the deflection of the diaphragm. Electrical noise can be reduced by eliminating wires that tend to pick up extraneous electrical signals.

DETAILED DESCRIPTION

The I.E.E.E. Standards Dictionary, Copyright 2009 by the IEEE, defines "via" as a physical connection between two different levels of interconnect, or between a level of interconnect and a physical or logical pin. As used herein, a via is a vertical or substantially vertical column of conductive material formed into a substrate having opposing top and bottom or first and second sides, regardless of its height or diameter. It also provides a physical and electrical connection between different levels of a pressure sensing element, e.g., between top and bottom surfaces of an element.

As described herein, a conductive via provides a vertically-oriented, electrically conductive pathway through or part way through a semiconductor substrate. A via can thus extend all the way through a substrate, i.e., between and through opposing top and bottom/first and second sides but can also extend only part way through a substrate. Conductive vias are considered herein to extend through a substrate and thus be located in and/or resident in a substrate.

As used herein, the term "bond pad" refers to conductive areas commonly found on external surfaces of an application-specific integrated circuit (ASIC) as well as a MEMS pressure sensing element. The bond pad term should not, however, be construed as being limited to or defining conductive areas of any particular area, thickness, shape or material but should instead be broadly construed to include a conductive area or surface of any size, which is located on, or embedded in, a surface of either an ASIC or a MEMS pressure sensing element to which an electrical connection can be made.

Figure 1:
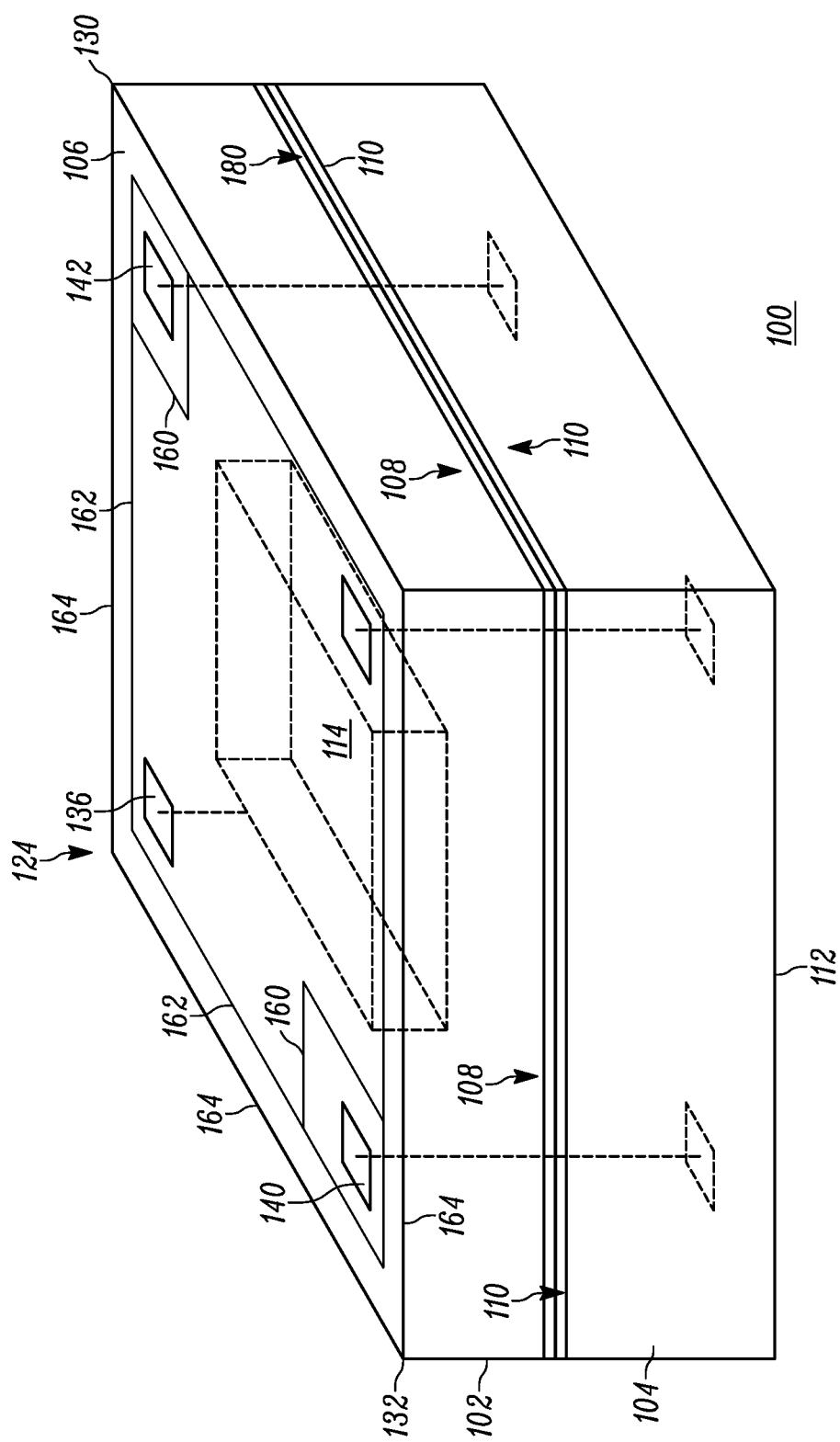
FIG. 1 is a perspective diagram of a MEMS piezoresistive pressure sensor having bond pads that carry electrical signals from a piezoresistive Wheatstone bridge circuit in the pressure sensor, and which are symmetrically distributed in the sensor.
Figure 2:
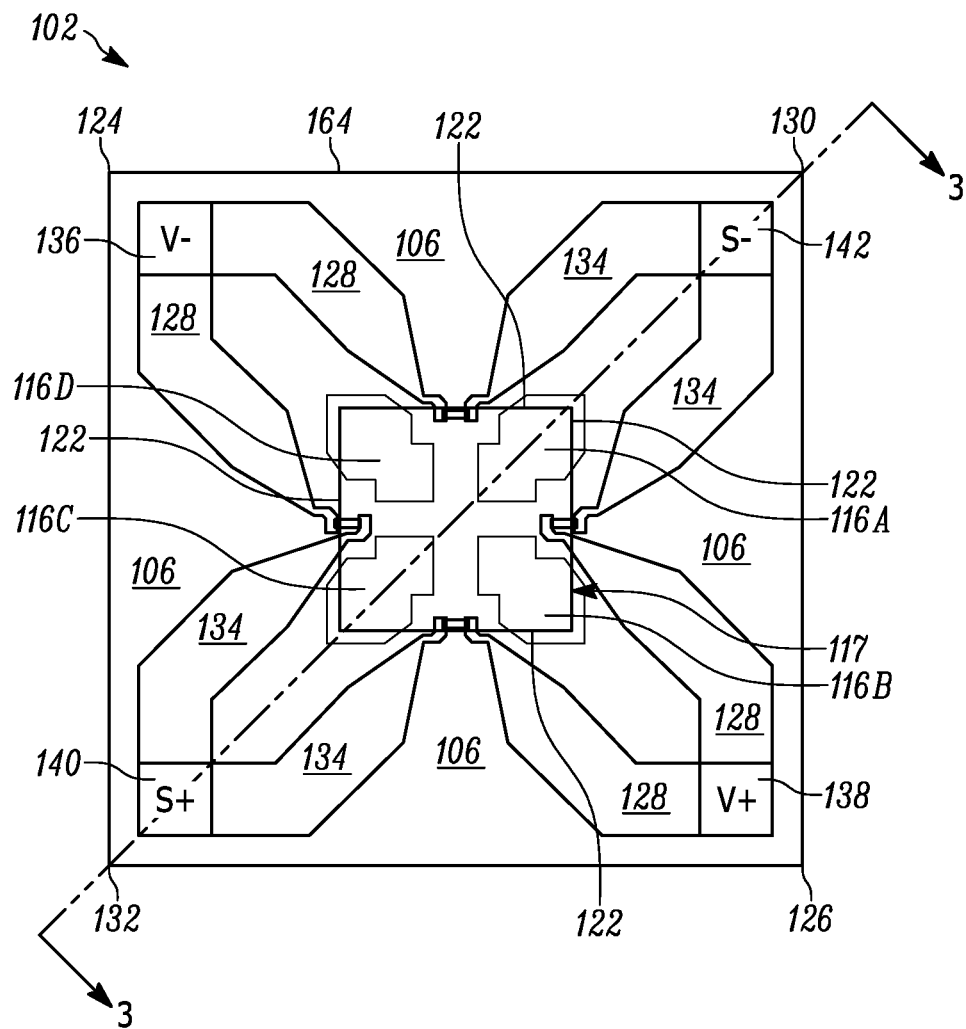
FIG. 2 is a top view of the MEMS piezoresistive pressure sensor shown in FIG. 1 and showing that each of the bond pads is proximate to one of the four corners of the MEMS piezoresistive pressure sensor.
Figure 3A:
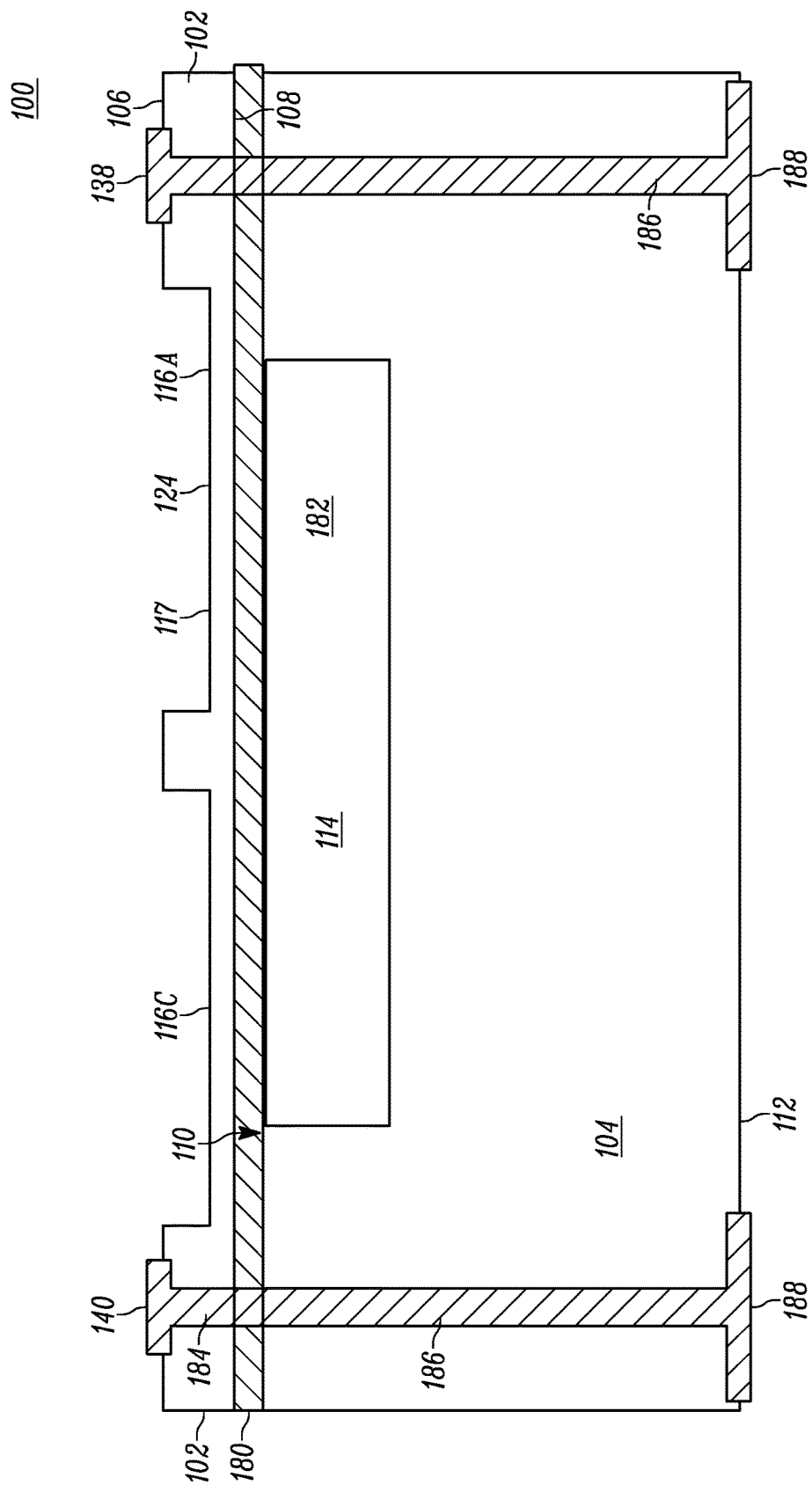
FIG. 3A is a cross-sectional view of a first embodiment of a MEMS piezoresistive pressure sensor element shown in FIG. 2, and which is considered to be an absolute pressure sensor.
Figure 3B:
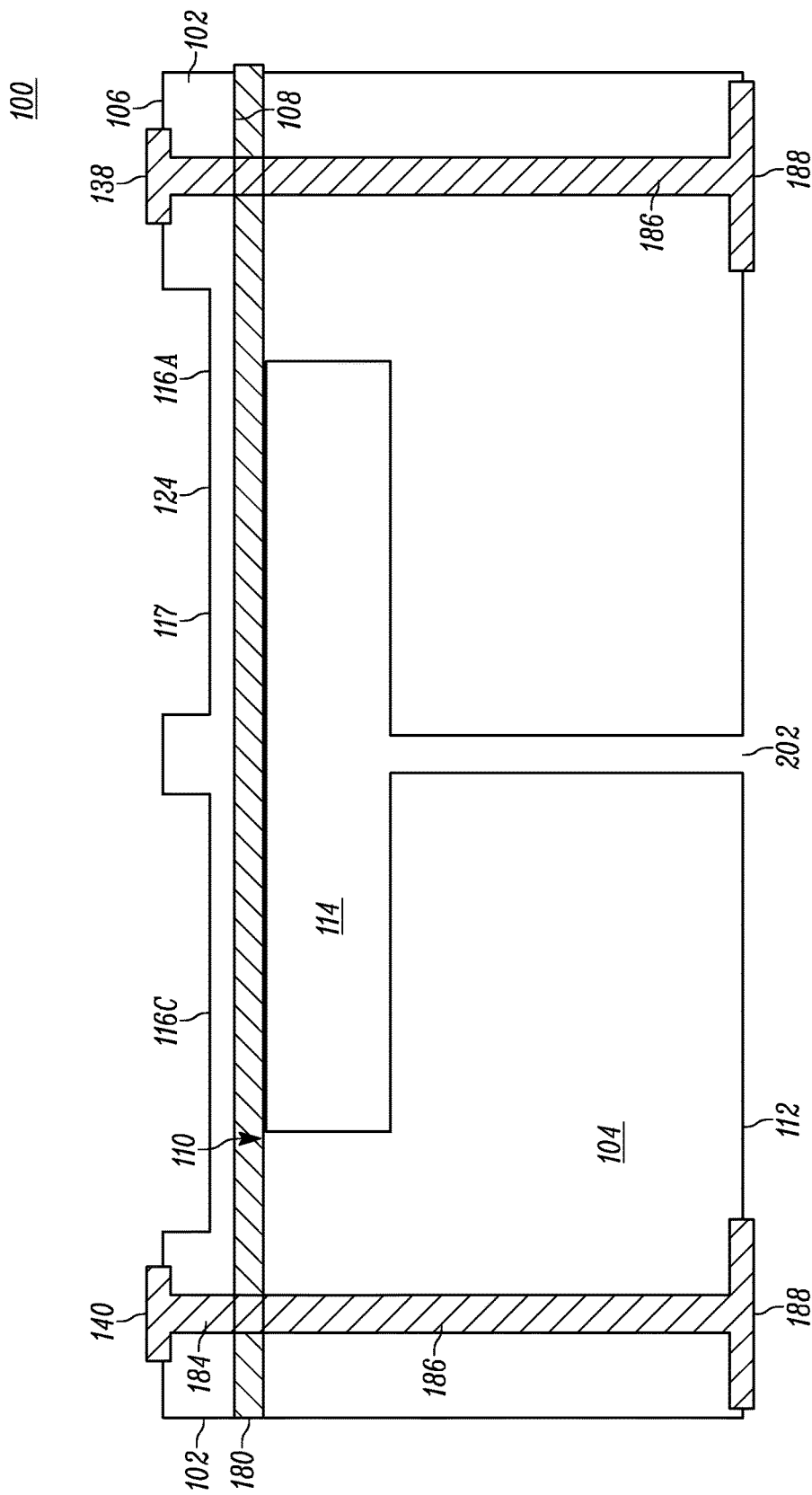
FIG. 3B is a cross sectional view of a second embodiment of a MEMS piezoresistive pressure sensor element shown in FIG. 2, and which is considered herein to be a differential pressure sensor.

With the foregoing definitions in mind, FIG. 1 is a perspective view of a symmetrical piezoresistive pressure sensor, also referred to herein as a micro-electromechanical system (MEMS) pressure sensing element 100 having symmetrical bond pads. FIG. 2 is a top or plan view of the top surface of the MEMS pressure sensing element 100, showing with broken lines the location of a diaphragm that deflects responsive to pressure. FIG. 3A is a cross-sectional view of the pressure sensing element taken through section lines 3-3 in FIG. 2. FIG. 3B is also a cross sectional view taken through section lines 3-3 but the MEMS pressure sensing element shown in FIG. 3B is of a differential pressure sensor, which differs from the sensor shown in FIG. 1 by the addition of a through-hole formed in the second substrate.

As shown in FIGS. 1, 2, 3A and 3B, the MEMS pressure sensing element 100 comprises two substrates 102 and 104 stacked on top of each other. The two substrates 102, 104, preferably made of silicon, are mechanically connected to each other by a thin bonding layer 180 between the two substrates 102, 104.

The first or top substrate 102 is a thin piece of silicon having a top surface 106 and an opposing bottom surface 108. The second substrate 104, which is also considered herein to be a lower or bottom substrate relative to the top substrate 102, is thicker and referred to herein as a supporting substrate. The second substrate 104 is also made of silicon. The second substrate 104 has its own top surface 110 and its own bottom, opposing surface 112.

As can be seen in FIG. 3A, the top surface 110 of the second or supporting substrate 104 has a recess 114 formed into the top surface 110 of the second substrate 104. When the two substrates 102 and 104 are joined together in an evacuated environment, i.e., when the first or top substrate 102 is attached to the top surface 110 of the second substrate 104, the recess 114 becomes an evacuated cavity located directly below a thinned out-region 116 of the top substrate 102. The thinned out-region 116 of the top substrate 102 thus forms a diaphragm 117, which deflects upwardly and downwardly responsive to pressure applied to the top surface of the diaphragm 117.

Resistors formed into the thinned out-region 116 by selectively doping localized regions of the thinned-out region, are electrically connected to each other to form a distributed Wheatstone bridge, the topology of which is well-known to those of ordinary skill in the electronic art. As is well known, the resistors forming the bridge circuit change in size and resistance when the diaphragm deflects.

When a constant or fixed voltage is applied to the input terminals of the piezoresistive Wheatstone bridge circuit, the voltage at the output terminals of the bridge circuit will change responsive to diaphragm deflection. Since the diaphragm 117 shown in FIG. 3A will deflect responsive to pressure applied to the top side of the diaphragm 117, the sensor depicted in FIG. 3A comprises what is generally known as a top-side or absolute pressure sensor because diaphragm deflection and hence output voltage change is due to changes in the pressure applied to only the top side of the diaphragm 117.

FIG. 3B is a cross sectional view of a second embodiment of a symmetrical piezoresistive pressure sensor 200 and which is considered herein to be a differential pressure sensor 200. The structure shown in FIG. 3B differs from the structure shown in FIG. 3A by only the addition of a hole or port 202 formed into the second substrate 104. The hole 202 extends through the second substrate 104 from its bottom surface 112 upwardly into the recess 114 formed into the top surface 110 of the second substrate 104. The recess 114 is thus not evacuated.

The hole 202, which is preferably formed by etching, has a circular cross section. It is sized to be large enough to allow fluid to pass through the hole 202, into the recess and 114 and apply pressure against the backside of the diaphragm 117. Deflection of the diaphragm 117 is thus determined by a difference in the pressure applied to the top side of the diaphragm and the pressure applied to the bottom side through the hole 202. The signals output from the piezoresistive Wheatstone bridge formed into the diaphragm 117 thus represent a difference between the pressure applied to the two sides of the diaphragm 117.

Figure 4A:
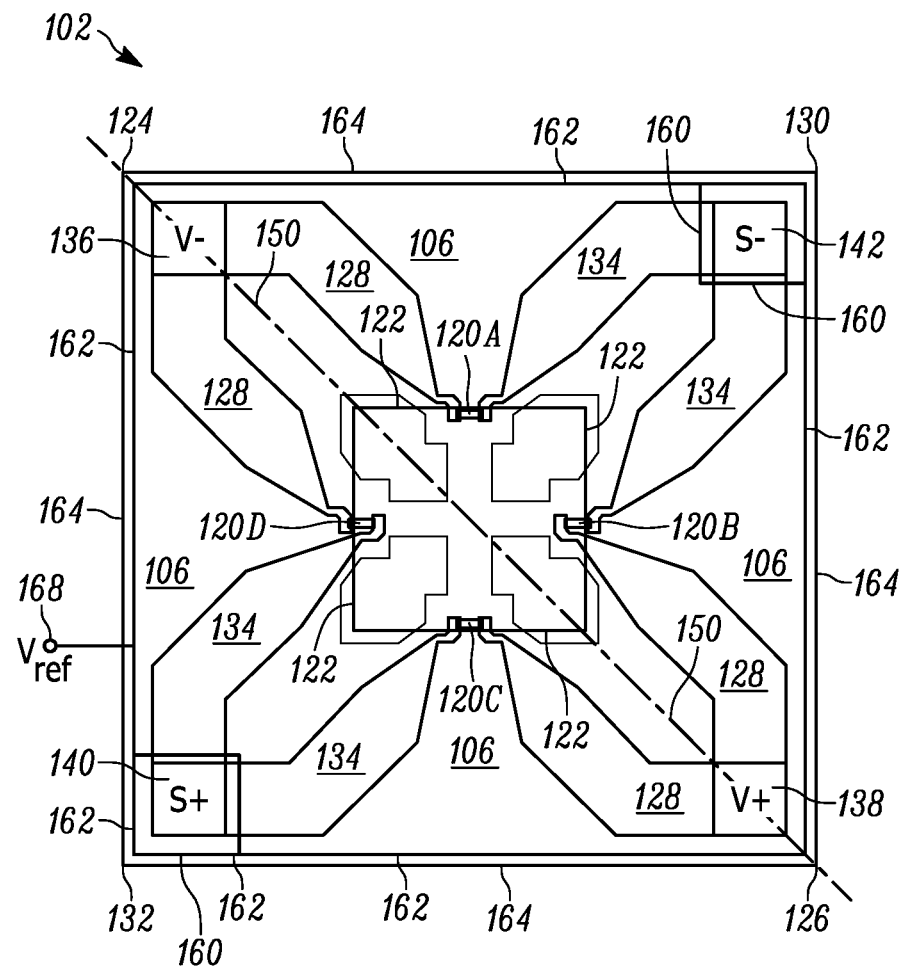
FIG. 4A is a second top view of the MEMS piezoresistive pressure sensor element shown in FIG. 1 showing details of the preferred embodiment of a bond pad layout, including the location of a distributed Wheatstone bridge circuit in the sensor element, the shape and location of conductive interconnects, bond pads for input and output signals and which are electrically connected to the conductive interconnects, ground rings that surround two of the bond pads that have output signals from the Wheatstone bridge, a ground loop that surrounds the entire surface, and, a plane of symmetry for the pressure sensor element.

FIG. 4A is a top or plan view of the top surface 106 of a preferred embodiment of the first or top substrate 102 showing locations of piezoresistors 120A, 120B, 120C and 120D, which are connected to form a distributed piezoresistive Wheatstone bridge circuit. As is well known, a Wheatstone bridge has four terminals or nodes, two of which are considers inputs, two of which are outputs.

The piezoresistors 120A, 120B, 120C and 120D are formed in the top surface 106 such that they are located next to edges 122 of the diaphragm 117 formed in the top substrate 102. FIG. 4A also shows the shapes and locations of conductive interconnects 128 and 134, which electrically connect the piezoresistors to the two input nodes 136, 138 and two output nodes 140 and 142. The nodes are referred to herein as bond pads.

Figure 5:
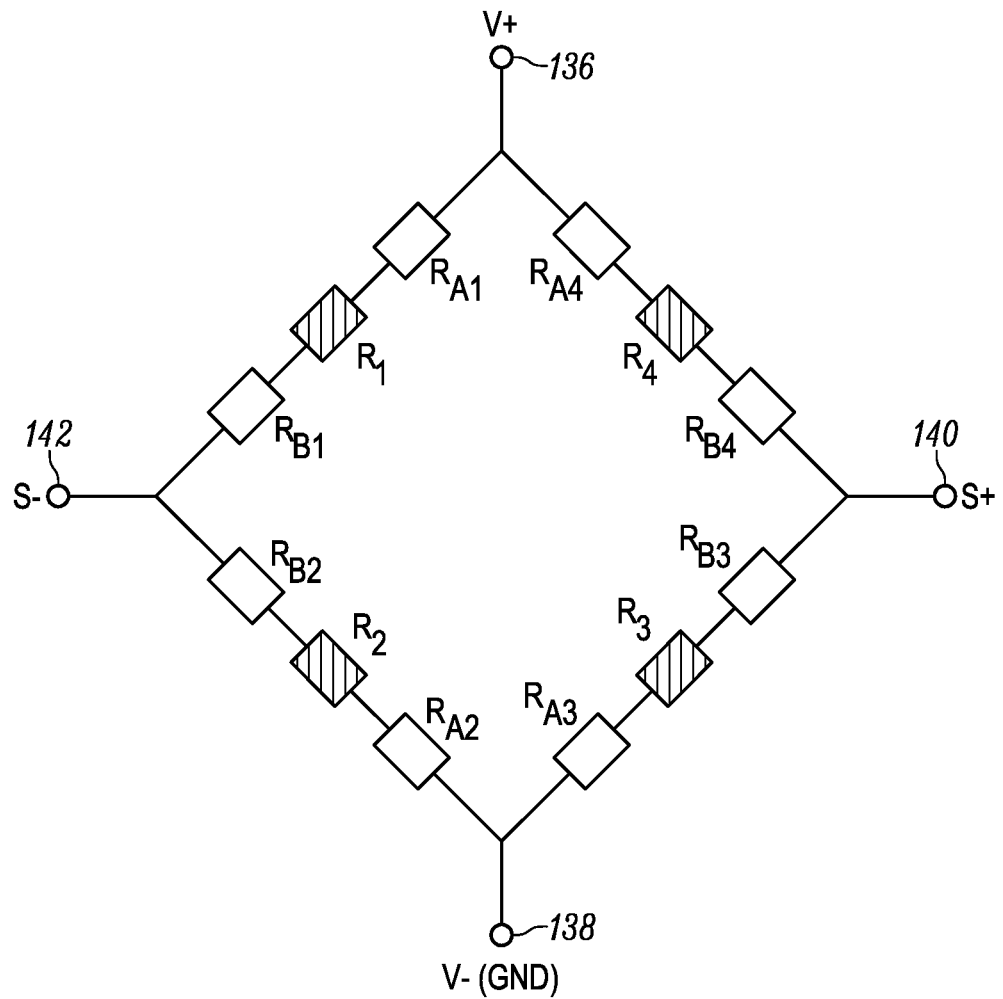
FIG. 5 is a schematic depiction of the electrical equivalent of the symmetrically distributed bond pads shown in FIGS. 4A, 4B and 4C.

FIG. 5 shows the topology of a resistive Wheatstone bridge circuit. It also shows the input nodes identified by reference numerals 136 and 138 and denominated in FIG. 5 as $V^+$ and $V^-$. as well as the output terminals or nodes identified by reference numerals 140 and 142 and denominated in the figure as S− and S+.

Referring again to FIG. 4A, the two input nodes 136, 138 of the Wheatstone bridge circuit are located at diagonally opposite corners 124 and 126 of the silicon substrate 102. Similarly, the two output nodes 140 and 142 of the Wheatstone bridge circuit are located at diagonally opposite corners 130, 132.

Electrical connections between the two input terminals 136, 138 and piezoresistive elements of the Wheatstone bridge circuit are made by selectively doping the top surface 106 to form the aforementioned conductive interconnects 128. Electrical connections are made between the two output terminals 130, 132 and piezoresistive elements of the Wheatstone bridge circuit by different sets of interconnects 134, also formed by selectively doping areas of the top surface 106.

In FIG. 5, the resistors labeled as R1, R2, R3 and R4 comprise the resistors that form the Wheatstone bridge circuit. Secondary resistors labeled as RA1, RA2, RA3, RA4, RB1, RB2, RB3, and RB4 represent the relatively small resistances of the interconnects 128 and 134, the resistances of which are essentially constant, even when the diaphragm deflects.

Figure 4B:
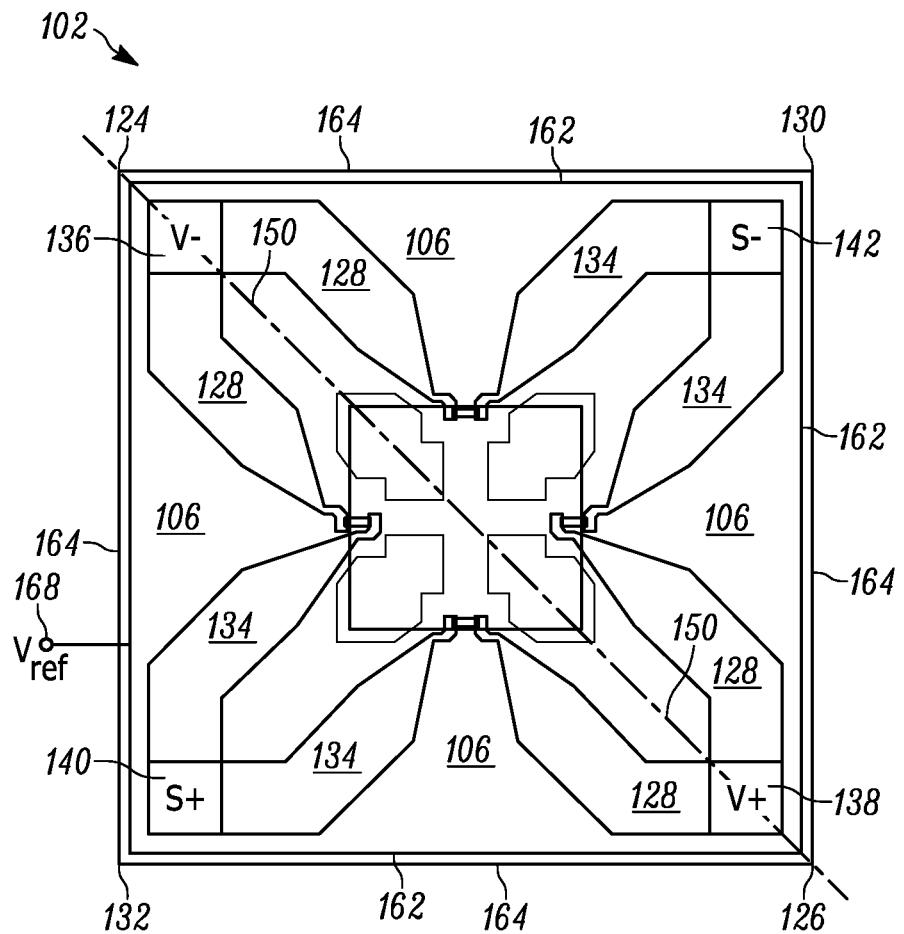
FIG. 4B is a third top view of the MEMS piezoresistive pressure sensor element shown in FIG. 1 and details of a first alternate embodiment of a bond pad layout having a ground loop that surrounds the entire surface but no ground rings around the output signal bond pads.
Figure 4C:
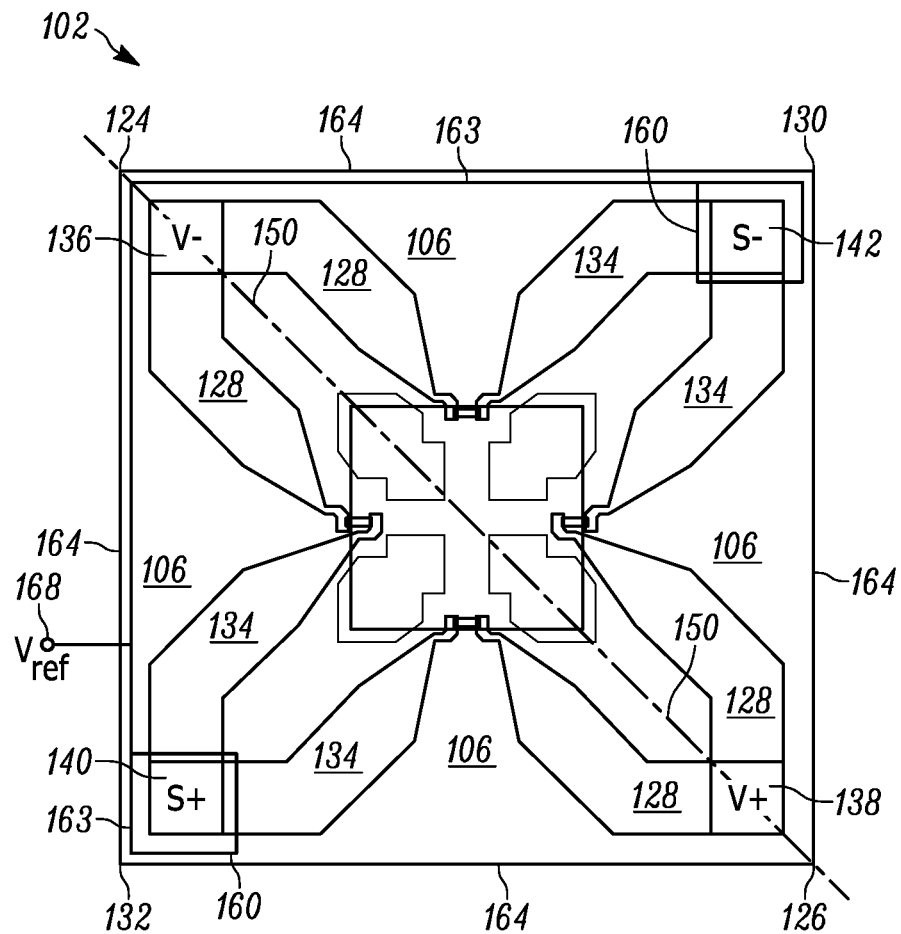
FIG. 4C is a fourth top view of the MEMS pressure sensor element shown in FIG. 1 and details of a second alternate embodiment of a bond pad layout having ground rings around the output signal bond pads but without a ground loop around the entire surface.

In FIG. 4A as well as FIGS. 4B and 4C a broken or "dashed" line 150 is shown extending between two diagonally opposite corners 124 and 126 of the substrate 102. The broken line 150 graphically depicts the edge of a geometric plane of symmetry of the substrate 102. The plane of symmetry is orthogonal to the top surface of the substrate 102 and thus extends into and out of the plane of FIGS. 4A, 4B and 4C.

The substrate 102 is considered herein to be symmetrical about the plane of symmetry because virtually every structure on the left or lower side of the plane/line 150 has a corresponding identical or substantially identical feature the right side or upper side of the plane/line 150. By way of example, the S+ output node 140 is diagonally opposite the S− output node 142. Both nodes 140 and 142 are also equidistant from the plane/line 150. The shape and size of interconnects 128 and 134 on each side of the plane/line 150 are substantially the same and equidistant or at least substantially equidistant from the plane/line 150. Similarly, the resistive elements of the Wheatstone bridge circuit on one side of the plane/line 150 are matched or correspond to equivalent elements on the opposite side of the plane/line 150. The electrical and mechanical components and features of the MEMS pressure sensor element 100 are thus symmetrically distributed on the top surface 106 of the first silicon substrate 102 on either side of the plane/line 150. Mechanical or electrical noise signal picked up on one side of the plane/line 150 will often be cancelled or offset by a mechanical or electrical noise signal picked up on the opposite of the plane/line 150. The symmetrical distribution of components on the substrate 102 thus helps reduce adverse effects of electrical and mechanical noise on the signals output from the piezoresistive Wheatstone bridge circuit.

Still referring to FIG. 4A, the input terminals 136 and 138 and the output terminals 140 and 142 of the Wheatstone bridge circuit that are located on the top surface 106 are collectively referred to herein as bond pads, which as described above are conductive areas to which electrical connections can be made. Bond pads are commonly found on external surfaces of integrated circuits including the ASIC and MEMS pressure sensing element described herein.

As used herein, the term "circumscribe" refers to a continuous surroundment of an area, surface or physical feature of a substrate by a material, especially a material that conducts electricity, regardless of the shape, thickness or composition of the material that circumscribes.

In FIG. 4A, the bond pads for the output terminals or nodes 140 and 142 of the Wheatstone bridge circuit are completely circumscribed or surrounded by substantially square-shaped patterns of conductive material or conductive doping. The conductive material around the bond pads is identified by reference numeral 160.

The conductive patterns and/or conductive material 160 surrounding the bond pads 140, 142, regardless of its shape, are referred to herein as conductive rings 160. The rings 160 are also electrically connected to an electrically conductive loop 162 that extends completely around the perimeter of the top surface 106. Circular, elliptical, rectangular and polygon-shaped rings that circumscribe a bond pad are considered herein to be equivalent alternate embodiments of the substantially square-shaped conductive rings 160 shown in FIGS. 4A-4C.

In addition to the conductive rings 160, a substantially square-shaped conductive loop 162 is located adjacent to the edges or outside surfaces 164 of the top surface 106 of the substrate 102. The conductive loop 162 thus completely "surrounds" the input bond pads 136, 138 the output bond pads 140 and 142, the interconnects 128 and 134, the conductive rings 160 and the Wheatstone bridge circuit.

It is important to note that the conductive rings 160 and the conductive loop 162 are preferably co-planar with each other due to how they are both formed. The rings 162 and loop 160, however, are not co-planar with any of the interconnects 128, 134. Nor are the conductive rings 160 and conductive loop 162 electrically connected to the interconnects 128, 134. Stated another way, the conductive rings 160 and conductive loop 162 do not physically or electrically intersect any of the interconnects 128, 134 despite their being depicted in the figures as crossing or intersecting each other. The conductive rings 160 and conductive loop 162 are actually vertically separated from the interconnects 128, 134 by a distance equal to the thickness of a thin dielectric embodied as four separate non-conductive layers, best seen in FIG. 4D.

Figure 4D:
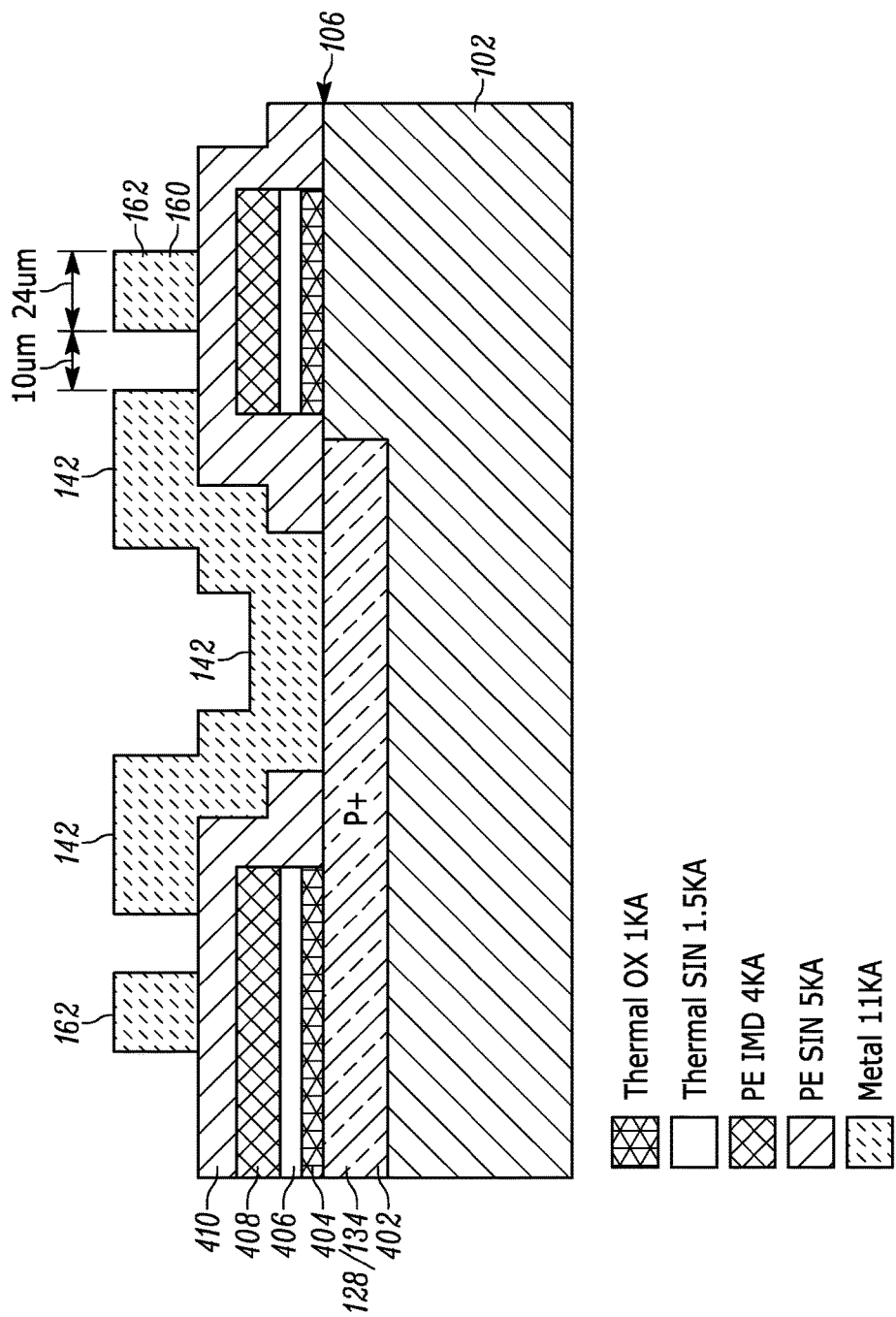
FIG. 4D is a cross sectional view of one of a bond pad, circumscribed or surrounded by a conductive ring.

FIG. 4D is a cross sectional view of one of the bond pads 142, which is considered herein to be circumscribed by a conductive ring 160. The ring 160 is also electrically connected to a conductive loop 162, which circumscribes essentially the entire top surface 106 of the top substrate 102.

In FIG. 4D, a conductive layer of P+-type material 402 is doped into the top surface 106 of the top substrate 102 to form a conductive interconnect identified in FIGS. 4A, 4B and 4C by reference numerals 128 and 134.

In a preferred embodiment, a first non-conductive layer 404 made of silicon oxide is thermally grown over the P+ conductive material 402 that forms a conductive interconnect 128, 134. A second non-conductive layer 406 made of silicon nitride is deposited over the first layer of silicon oxide 404. A third non-conductive layer 408, also made of silicon oxide is deposited over the silicon nitride layer 406. Finally, a fourth non-conductive layer 410, also made of silicon nitride, is deposited over the third layer 408.

The dielectric thus formed between the conductive rings 160, the conductive loop 162 and the interconnects 128, 134 is thin. The vertical distance separating the substantially co-planar conductive loops 160 and conductive ring 162 from the interconnects 128 and 134, which are of course substantially planar, is thus correspondingly small. In the preferred embodiment, the first layer 404, which is silicon oxide has a thickness of about 0.1 micrometers; the second layer 406 has a thickness of about 0.15 micrometers; the third layer 408 has a thickness of about 0.4 micrometers; the fourth layer 410 has a thickness of about 0.5 micrometers. The conductive rings 160 and ground loop 162 are thin, having a width of about 24 micrometers. They are laterally separated from the bond pads by a short air gap distance of about 10 micrometers. The widths of the conductive rings 160 and conductive loop 162 are preferably the same and about 24 micrometers.

Notwithstanding the fact that the bond pads, conductive rings 160 and conductive loop 162 are not co-planar but are in fact vertically offset from each other by the thickness of the non-conductive layers 404, 406, 408 and 410, the conductive rings 160 are considered herein as circumscribing the conductive bond pads. The conductive loop 162 is considered as circumscribing the conductive rings 160 and other features on the top surface 106 of the top substrate 102.

In the preferred embodiment, the conductive rings 160 and the conductive loop 162 are electrically connected together. Both the rings 160 and the loop 162 are electrically connected to a fixed, D.C. reference potential 168 voltage. In the preferred embodiment, the fixed reference potential 168 is preferably ground or zero volts. In alternate embodiments, however, the fixed D.C. voltage 168 can be a non-voltage that is either positive or negative.

The conductive rings 160 and the conductive loop 162 were experimentally determined to reduce the effect of electro-static discharge on the signals output from the Wheatstone bridge. When they are connected to a reference potential they are believed to provide a pathway for induced voltages to the fixed reference potential voltage, i.e., they provide a ground plane around the output signal bond pads 140, 142, shunting induced voltages to ground or some other fixed voltage where they are dissipated.

FIG. 4B depicts a first alternate embodiment of a silicon substrate 102B for a MEMS pressure sensing element 100, which does not have conductive rings around the output signal bond pads 140 and 142 shown in FIG. 4A. In FIG. 4B, the top surface of the substrate differs from the top surface shown in FIG. 4A by only the absence of conductive rings around the output signal bond pads 140 and 142, i.e., the bond pads 140, 142 from which an output signal from the Wheatstone bridge is obtained.

FIG. 4C depicts a second alternate embodiment of the top surface of a silicon substrate, which omits the conductive loop shown in FIG. 4A. The embodiment shown in FIG. 4C differs from that shown in FIG. 4A by only the absence of a conductive loop around the periphery of the top surface of the substrate. The output signal bond pads 140, 142 are circumscribed by conductive rings 160, however, and which carry a fixed voltage. The reference or fixed voltages attached to the conductive rings can be either the same or different.

Referring again to FIG. 3A as well as 3B, the cross section of the MEMS pressure sensing elements shown in those figures shows a layer of material 180 between the top substrate 102 and the supporting substrate 104. The layer of material 180 between the substrates 102, 104 is preferably a thin layer of silicon dioxide which acts as a bonding layer, holding the top substrate 102 and the bottom substrate 104 together.

As stated above with respect to FIG. 3A, when the top substrate 102 and lower supporting substrate 104 are joined to each other in a vacuum, the recess 114 formed in the top surface 110 of the supporting substrate 104 forms an evacuated cavity 182. The area immediately above the evacuated cavity 182 is the aforementioned thinned-out region 116, which acts as the aforementioned diaphragm 117 in which the piezoresistive elements shown in FIGS. 4A, 4B, and 4C are formed. When the second substrate 104 has a through-hole 202 as shown in FIG. 3B, diaphragm deflection is due to differences between the pressures applied to the top and bottom sides of the diaphragm 117.

Also shown in FIGS. 3A and 3B conductive vias are formed in both substrates 102 and 104 to extend completely through the substrates 102 and 104. The vias are also electrically connected to each other when the substrates are stacked on top of each other and joined as shown in FIGS. 1, 3A and 3B. More particularly, and with respect to both FIGS. 3A and 3B, the conductive vias identified by reference numeral 184 extend completely through the top substrate 102, i.e., from the bond pads 138 and 140 located on the top surface 106 of the top substrate, to the bottom surface 108 of the top substrate 102.

Conductive vias identified by reference numeral 186 are formed in the second or supporting substrate 104. Those vias 184 are located directly below, aligned with and electrically connected to the vias 184 in the top substrate 102 and extend through the supporting substrate 104 to make electrical contact with secondary bond pads 188 formed in the bottom surface 112 of the supporting substrate 108.

The conductive vias 184 through the top substrate 102 and the conductive vias 186 through the supporting substrate 104 are aligned with each other as well as the bond pads in the top surface 104 of the top substrate 102. Since the bond pads in the top surface 104 are symmetrically distributed across or through the MEMS pressure sensing element 100, the conductive vias 184 and 186, which are vertically aligned with and connected to the bond pads, are also symmetrically distributed and provide a conductive pathway between the bond pads 188 on the bottom side 112 of the supporting substrate and the piezoresistive elements formed in the top surface 104 of the top substrate 102. The symmetry of the conductive vias assists in minimize thermally-induced stress that might otherwise result if the vias were located along one side or edge of the substrates 102, 104.

Figure 6A:
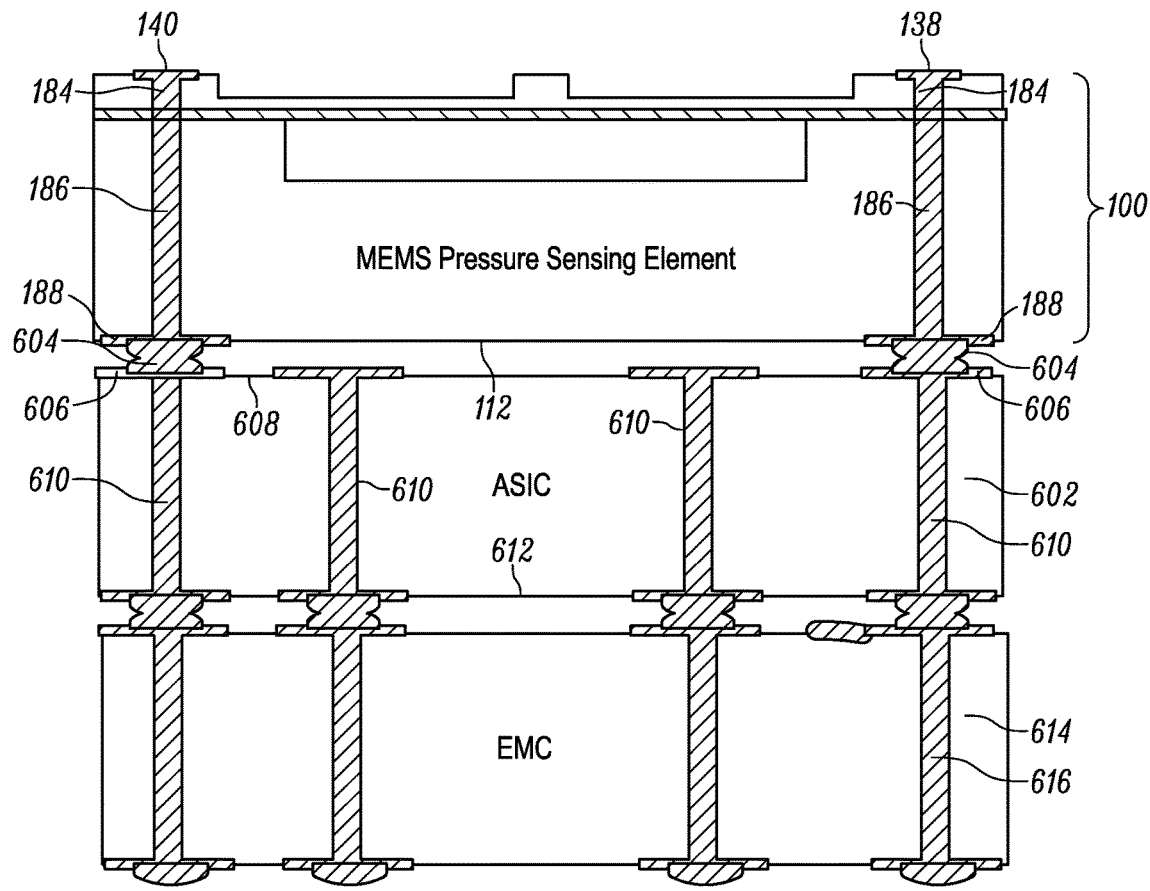
FIG. 6A is a cross sectional view of a preferred embodiment of a symmetrical piezoresistive pressure sensor with stacked integrated circuits.

FIG. 6A is a cross sectional view of a first embodiment of a MEMS pressure sensor 600. It comprises the MEMS pressure sensing element 100 shown in FIGS. 1-5 and an application specific integrated circuit (ASIC) 602 mechanically coupled to the bottom side 112 of the MEMS pressure sensing element 100.

The ASIC 602 is formed from a silicon substrate into which electronic devices are formed using conventional methods. Electrically conductive vias 610 formed through the ASIC 602 extend through the ASIC 602 between its top surface 608 and an opposing bottom surface 612. The conductive vias 610 in the ASIC 602 are aligned with and connected to the conductive vias 186 formed in the MEMS pressure sensing element 100. The conductive vias 610 carry signals from either the MEMS pressure sensing element 100 and/or the ASIC 602 downwardly through the ASIC 602 to a third integrated circuit 614, having its own set of conductive vias 616 and which comprises of course a third silicon substrate into which electronic devices are formed using conventional methods.

Except for being formed with vias and bond pads, the ASIC 602 is electrically a prior art device that processes signals output from the MEMS pressure sensing element 100 in circuitry formed into the ASIC 602. Such circuitry can be formed into a top surface, a bottom surface or inside the substrate from which the ASIC is formed.

Since the conductive vias 610 formed in the ASIC 602 align with and are electrically connected to the conductive vias 186 in the supporting substrate, the vias in the ASIC 602 are also symmetrically distributed in the ASIC 602.

Figure 6B:
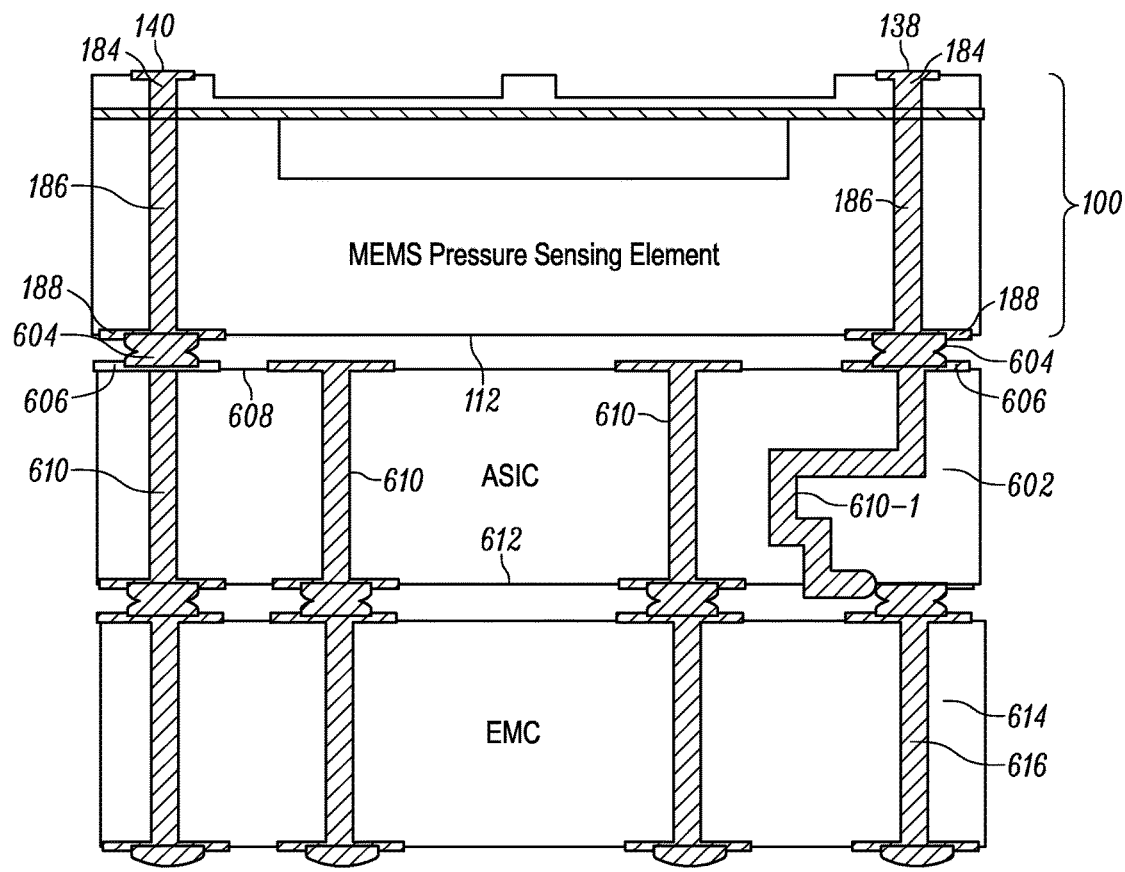
FIG. 6B is a cross sectional view of an alternate embodiment of a symmetrical piezoresistive pressure sensor with stacked integrated circuits.

In an alternate embodiment shown in FIG. 6B, the conductive vias 610-1 that extend through the ASIC 602 are not symmetrically distributed but make lateral or sideways direction changes. Such a conductive via 610-1 is considered to be asymmetrically distributed.

Figure 7A:
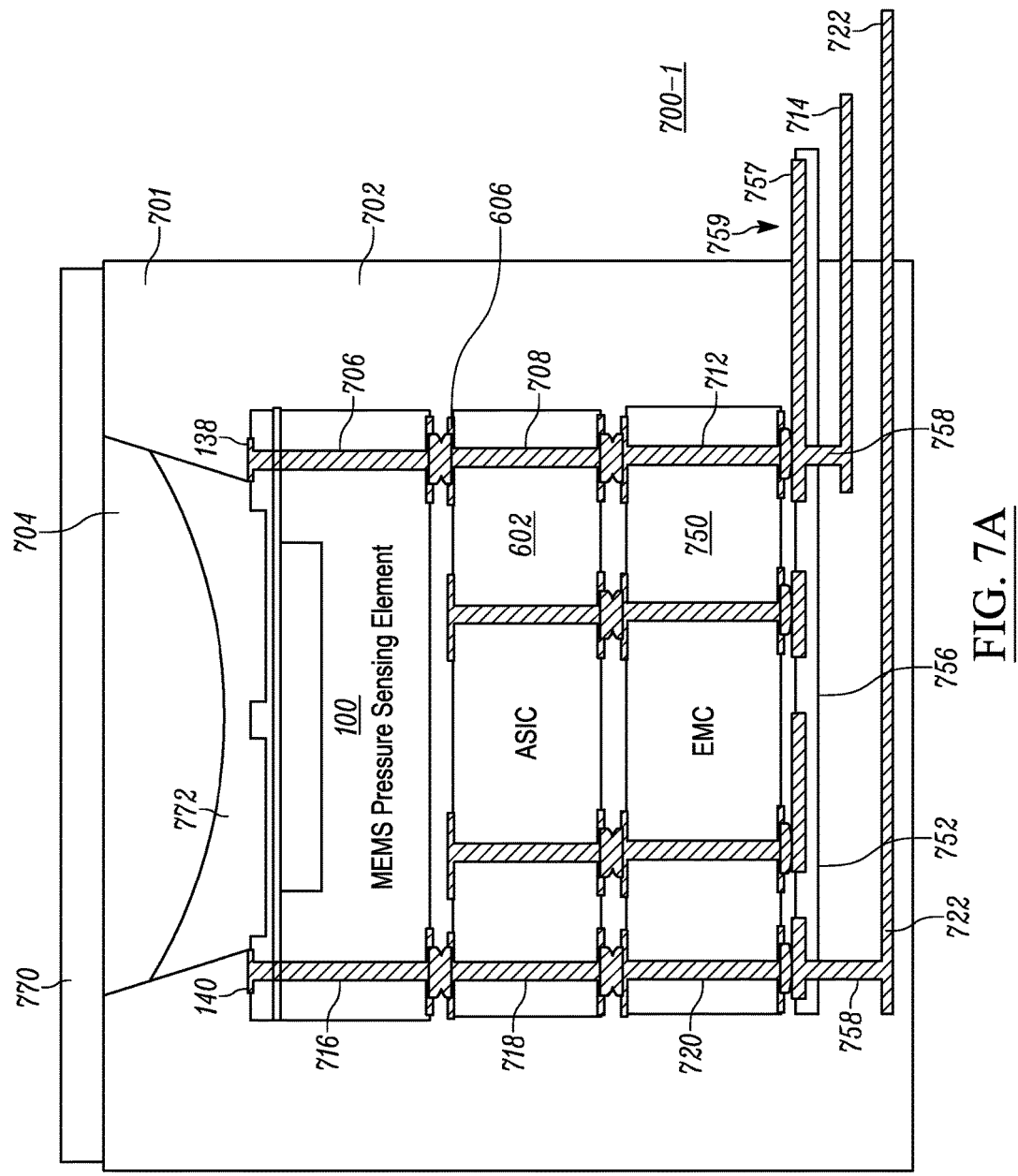
FIGS. 7A and 7B are cross-sectional views of different embodiments of a MEMS pressure sensor in a housing that encloses multiple integrated circuits.

FIG. 7A is a cross sectional view of a top side absolute MEMS pressure sensor 700-1. The pressure sensor 700-1 comprises a MEMS pressure sensing element 100 as shown in FIGS. 1-6A and 6B and two integrated circuits, i.e., a first application specific integrated circuit identified by reference numeral 602 and a second integrated circuit identified by reference numeral 750. The integrated circuits 602 and 750 are stacked. They are connected to each other and to the MEMS pressure sensing element using conductive vias (706, 716, 708, 718, 712 and 720) that extend through all three devices (100, 602 and 750).

Figure 7B:
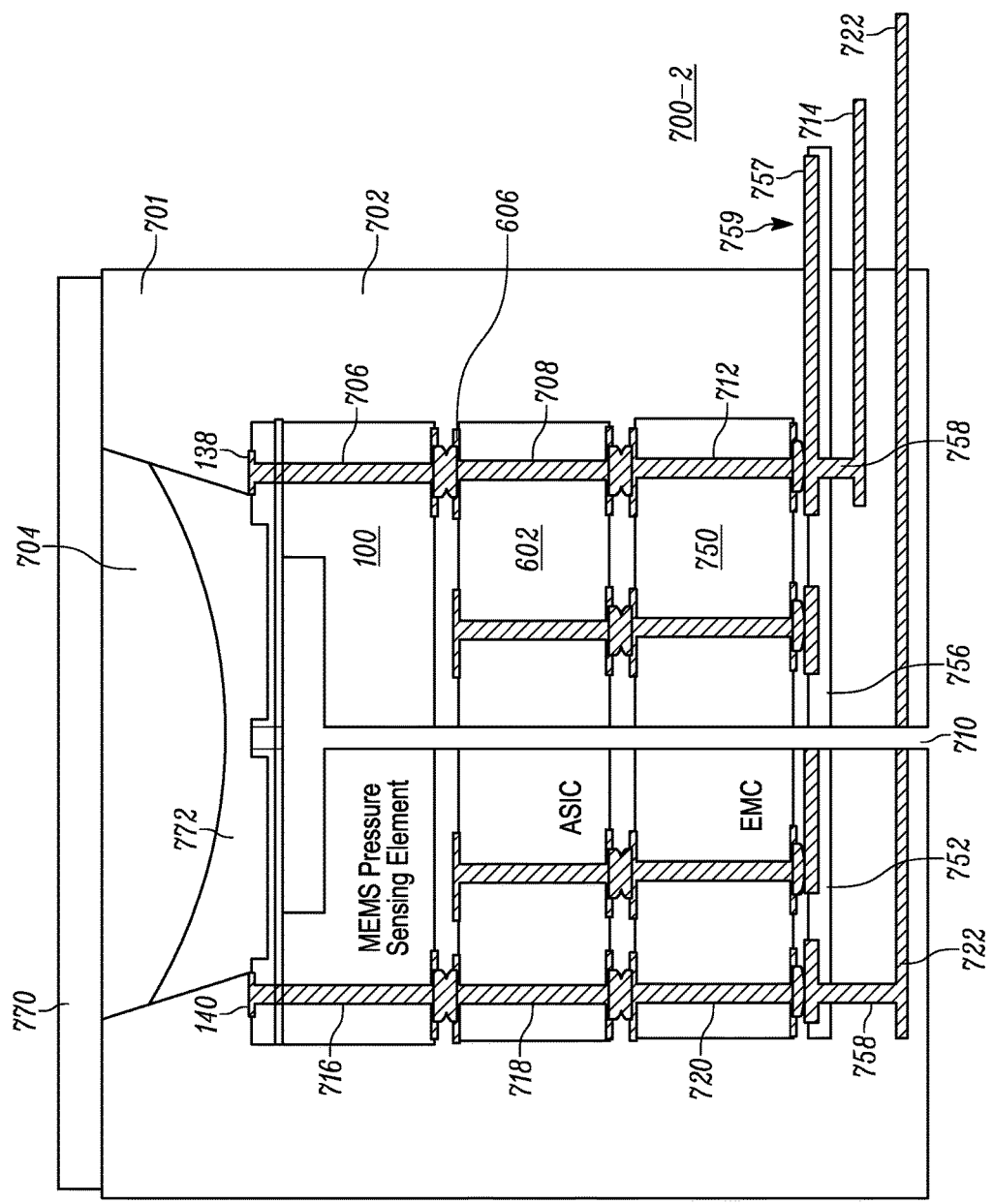

FIG. 7B is a cross sectional view of a differential MEMS pressure sensor 700-2. Except for a pressure port 710 shown as extending through the first integrated circuit 602, through the second integrated circuit 750 and through the MEMS pressure sensing element 100 the pressure sensor 700-2 shown in FIG. 7B is identical to the pressure sensor 700-1 shown in FIG. 7A.

In FIG. 7A as well as 7B, electronic devices in each of the three elements 100, 602 and 750 are connected to each other using conductive vias. A first conductive via 706 extends all the way through the MEMS pressure sensing element 100 in order to electrically connect a bond pad 138 of the MEMS pressure sensing element 100 to a bond pad 606 on the top surface of the ASIC 602. Another conductive via 708 extends completely through the ASIC 602 and thus extends the connection of the bond pad 138 through the ASIC 602 to a second integrated circuit 750. A third conductive via 712 that extends through the second integrated circuit 750 extends the connection of the bond pad downwardly to a circuit board 752 or a lead frame 714, which is simply a electrically conductive pathway, typically made of a rigid pin that extends through the housing 701 into which the MEMS pressure sensing element and the integrated circuits were placed.

On the left hand side of FIGS. 7A and 7B, conductive vias 716, 718 and 720 extend the bond pad 140 from the top surface of the MEMS pressure sensing element 100 downwardly to a second lead frame 722. The lead frames 714, 722 are considered herein as extending through the housing 701. Portions of the lead frames are thus located in and/or resident in the housing.

In one alternate embodiment, a "lead frame" is embodied as a conventional circuit board 756, preferably located at the bottom of the pocket 704 so that it can support the stacked assembly of the MEMS pressure sensing element and the integrated circuits 602, 750 and extend through the housing 701. Such a circuit board 756 has conductive "traces" on at least one of its external surfaces, as is well known to those of ordinary skill in the electronic art and an external portion 757, i.e., a portion external to the housing, where conductive traces 759 on the surface of the circuit board 756 are accessible and to which electrical connections can be made. Such a circuit board 756, its external portion 757 and conductive traces 759 provides a direct electrical connection to conductive vias in the integrated circuits 602, 750 and the MEMS pressure sensing element 100 as well as other conductive vias 758 formed into the housing and which can extend downwardly to other conductive lead frames 714 and 722.

In a preferred embodiment the pocket 704 is preferably provided a conventional plastic cover 770 that encloses the recess or pocket 704 and its contents. In a preferred embodiment of a backside pressure sensor, the pocket 704 is evacuated, which facilitates deflection of the diaphragm in the MEMS pressure sensing element responsive to pressure changes in the through hole 710 that extends through two stacked integrated circuits 602 and 750. In one alternate embodiment, a viscous gel 772 is added into the pocket covering the MEMS pressure sensing element 100. In an alternate embodiment, the gel can be omitted.

It is important to note that the use of the conductive vias in the MEMS pressure sensing element and the integrated circuits enables an electrical connection between the piezoresistor elements of the Wheatstone bridge formed in the MEMS pressure sensing element and devices external to the housing 702 by way of only conductive vias and portions of lead frames extending through the housing 702. Stated another way, the use of conductive vias and stacking the MEMS pressure sensing element with integrated circuits omits the need for conductive wires that would otherwise tend to pick up stray electric fields and electrostatic noise. Symmetrically arranging or structuring the MEMS pressure element components further reduces noise due to the cancellation of induced voltages.

The foregoing description is for purpose of illustration only. The true scope of the invention is set forth in the following claims.

What is claimed is:

1. A microelectromechanical system (MEMS) pressure sensing element comprising:
   a first silicon substrate having a top surface having a plurality of bond pads, which are symmetrically distributed on the top surface; and
   a conductive loop carrying a fixed voltage and which circumscribes the plurality of bond pads, the conductive loop being symmetrically distributed on the top surface.

2. The MEMS pressure sensing element of claim 1, wherein at least one of the bond pads is circumscribed by a conductive ring carrying a second fixed voltage.

3. The MEMS pressure sensing element of claim 2, wherein the conductive ring and bond pads are vertically separated from each other by a dielectric.

4. The MEMS pressure sensing element of claim 1, wherein the first silicon substrate has an opposing bottom surface, the first silicon substrate further comprising conductive vias, which extend through the first silicon substrate from the bond pads to the bottom surface.

5. The MEMS pressure sensing element of claim 4, further comprising a second silicon substrate having a top surface and an opposing bottom surface, the top surface of the second silicon substrate having a recess and having conductive vias that extend between the top and bottom surfaces of the second silicon substrate, the top surface of the second substrate being attached to the bottom surface of the first silicon substrate, the conductive vias through the second silicon substrate being aligned with and electrically connected to conductive vias that extend through the first silicon substrate.

6. The MEMS pressure sensing element of claim 5, wherein the recess is substantially evacuated.

7. The MEMS pressure sensing element of claim 5, further comprising a third substrate, which is electrically connected to at least one of the first silicon substrate and the second silicon substrate by conductive paths that reside in the third substrate.

8. The MEMS pressure sensing element of claim 7, further comprising a housing having a pocket, configured to receive and enclose the first silicon substrate, the second silicon substrate and at least partially enclose the third substrate.

9. The MEMS pressure sensing element of claim 8, further comprising a gel covering the MEMS pressure sensing element in the pocket.

10. The MEMS pressure sensing element of claim 4, further comprising a second silicon substrate having a top surface and an opposing bottom surface, the top surface of the second silicon substrate having a recess and conductive vias that extend between the top and bottom surfaces of the second silicon substrate, the top surface of the second substrate being attached to the bottom surface of the first silicon substrate, the conductive vias through the second silicon substrate being aligned with conductive vias that extend through the silicon substrate, the second silicon substrate additionally having a hole that extends from the bottom surface of the second silicon substrate to the recess, the hole being configured to allow a fluid to pass through the hole and into the recess.

11. The MEMS pressure sensing element of claim 10, further comprising a third substrate, which is electrically connected to at least one of the first silicon substrate and the second silicon substrate by conductive paths that reside in the third substrate.

12. The MEMS pressure sensing element of claim 11, further comprising a housing having a pocket, which is configured to receive and at least partially enclose the first silicon substrate, the second silicon substrate and at least partially enclose the third silicon substrate.

13. A MEMS pressure sensor comprising:
a first silicon substrate having a piezoresistive bridge formed in a top surface having a plurality of bond pads, the bond pads being symmetrically distributed on the top surface and around the piezoresistive bridge, the plurality of bond pads and piezoresistive bridge being circumscribed by a loop carrying a fixed voltage, the loop being symmetrically distributed on the top surface, the first silicon substrate additionally comprising conductive vias that extend through the first silicon substrate between the bond pads and the bottom surface;
a second silicon substrate having a top surface and an opposing bottom surface, the top surface of the second silicon substrate having a recess and conductive vias that extend between the top and bottom surfaces of the second silicon substrate, the top surface of the second substrate being attached to the bottom surface of the first silicon substrate, the conductive vias through the second silicon substrate being aligned with conductive vias that extend through the first silicon substrate; and
a third silicon substrate, which is mechanically coupled to the bottom of the second silicon substrate, the third silicon substrate comprising electronic circuitry, which processes signals output from the first silicon substrate, the third silicon substrate comprising conductive vias that extend at least part way through the second silicon substrate between the conductive vias in the first silicon substrate and the electronic circuitry in the third silicon substrate.

14. The MEMS pressure sensor of claim 13, wherein at least one of the bond pads is circumscribed by a conductive ring carrying a second fixed voltage.

15. The MEMS pressure sensor of claim 14, wherein the first and second voltages are substantially the same, wherein the loop carrying a first fixed voltage and the conductive ring carrying a second fixed voltage are substantially coplanar, the substantially co-planar conductive loop and conductive ring being vertically separated from the bond pads by a distance equal to a thickness of a dielectric located between the substantially co-planar conductive loop and conductive ring and the bond pads.

16. The MEMS pressure sensor of claim 15, wherein the recess is substantially evacuated.

17. The MEMS pressure sensor of claim 14, further comprising a fourth silicon substrate having electronic circuitry, which is connected to the electronic circuitry in the third silicon substrate with conductive vias.

18. The MEMS pressure sensor of claim 13, further comprising a housing having a pocket, which is configured to receive and enclose the first, second and third silicon substrates.

19. The MEMS pressure sensor of claim 18, further comprising a gel covering the first, second and third silicon substrates in the pocket.

20. The MEMS pressure sensor of claim 18, wherein the housing comprises a lead frame that extends from outside the housing into the pocket, wherein a portion of the lead frame in the pocket is electrically connected to the circuitry in at least one of the first, second and third silicon substrates by conductive vias.

21. The MEMS pressure sensor of claim 20, wherein the lead frame connects to a circuit board having conductive traces on a surface thereof.

* * * * *